United States Patent [19]

Davis

[11] Patent Number: 4,570,079

[45] Date of Patent: Feb. 11, 1986

[54] RF SWITCHING APPARATUS UTILIZING OPTICAL CONTROL SIGNALS TO REDUCE SPURIOUS OUTPUT

[75] Inventor: Charles A. Davis, Beverly, Mass.

[73] Assignee: Varian Associates, Inc., Palo Alto, Calif.

[21] Appl. No.: 467,113

[22] Filed: Feb. 16, 1983

[51] Int. Cl.[4] ............................ H03K 3/42; G06G 7/00
[52] U.S. Cl. ........................................ 307/311; 328/2; 328/14; 250/551; 307/529
[58] Field of Search .......... 307/260, 271, 311, 317 R, 307/529, 243; 250/551; 328/137, 152, 154, 14, 15, 72, 179, 2

[56] References Cited

U.S. PATENT DOCUMENTS

| | | | |
|---|---|---|---|
| 3,809,908 | 5/1974 | Clanton | 250/551 |
| 4,104,533 | 8/1978 | Iverson | 250/551 |
| 4,247,790 | 1/1981 | Sahasrabudhe et al. | 307/311 |
| 4,249,150 | 2/1981 | Bickley et al. | 333/262 |
| 4,324,981 | 4/1982 | Miller | 250/551 |
| 4,368,385 | 1/1983 | Kanbe et al. | 250/551 |

OTHER PUBLICATIONS

W. F. Green, "A Practical Fiber Optic Switch," *National Electronics Packaging and Production Conference Proceedings,* Anaheim, Calif., 1978, pp. 267–274.

*Primary Examiner*—Stanley D. Miller
*Assistant Examiner*—Timothy P. Callahan
*Attorney, Agent, or Firm*—Stanley Z. Cole; William R. McClellan

[57] ABSTRACT

An rf multiplexer includes a plurality of rf switch assemblies for switching a selected rf signal to an output in response to an optical control signal. Each rf switch assembly includes a switch circuit mounted in a conductive enclosure. The optical control signal from a control circuit is coupled by an optical fiber into the enclosure to an optical receiver which energizes a diode rf switch. Spurious conduction of rf signals along switch control lines is thereby eliminated without using filters. The multiplexer is particularly useful in a direct frequency synthesizer requiring high speed switching.

11 Claims, 3 Drawing Figures

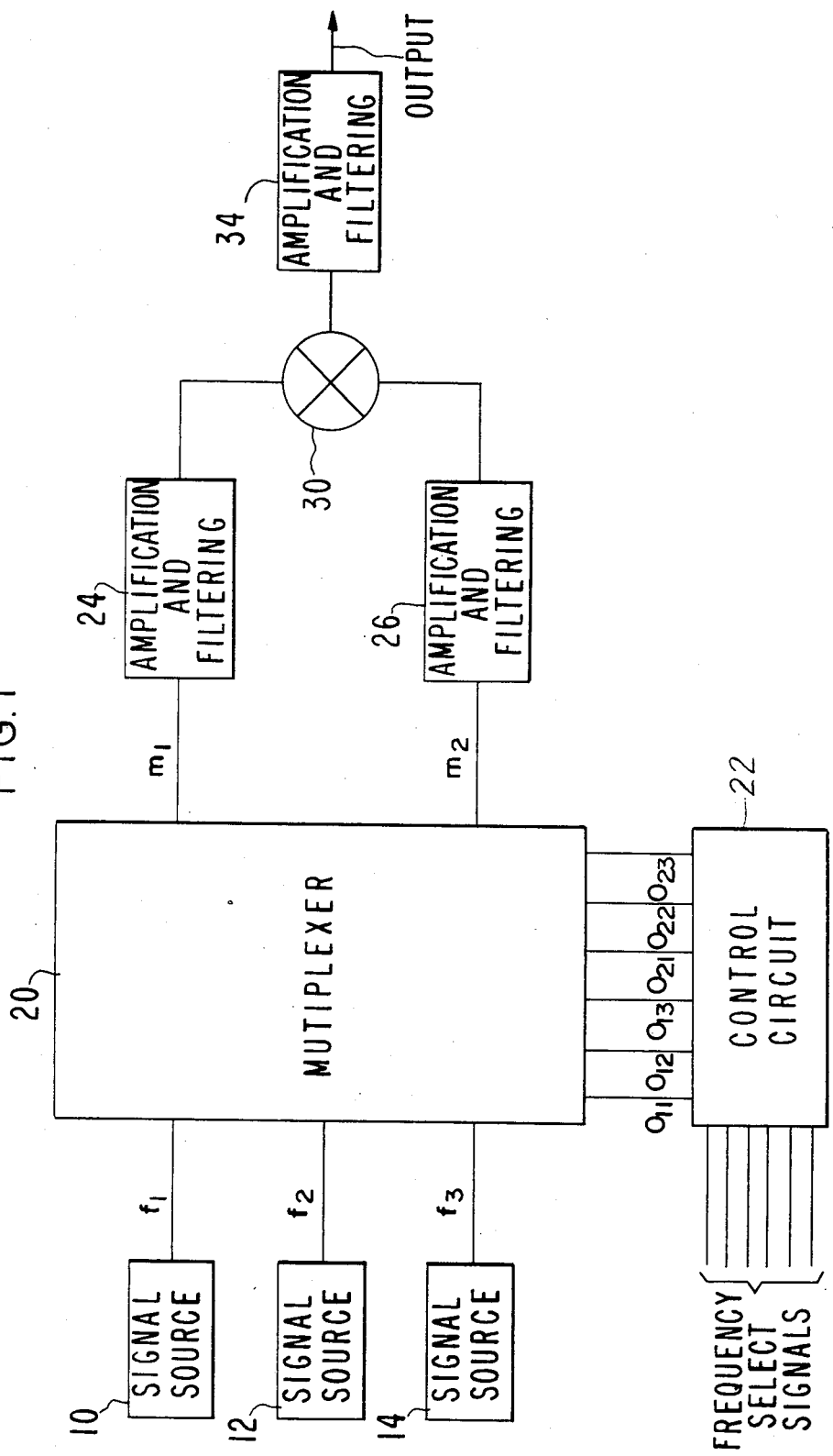

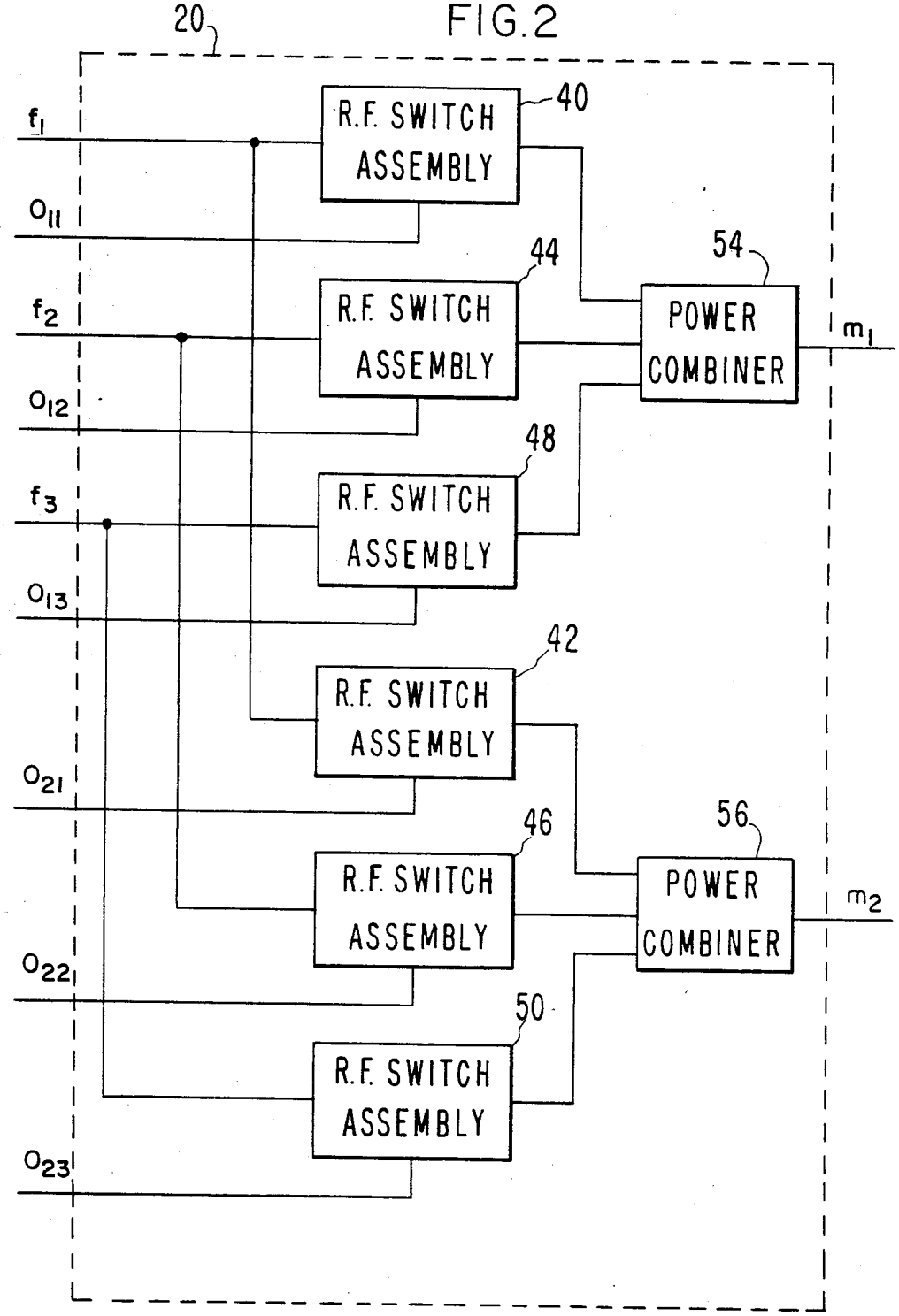

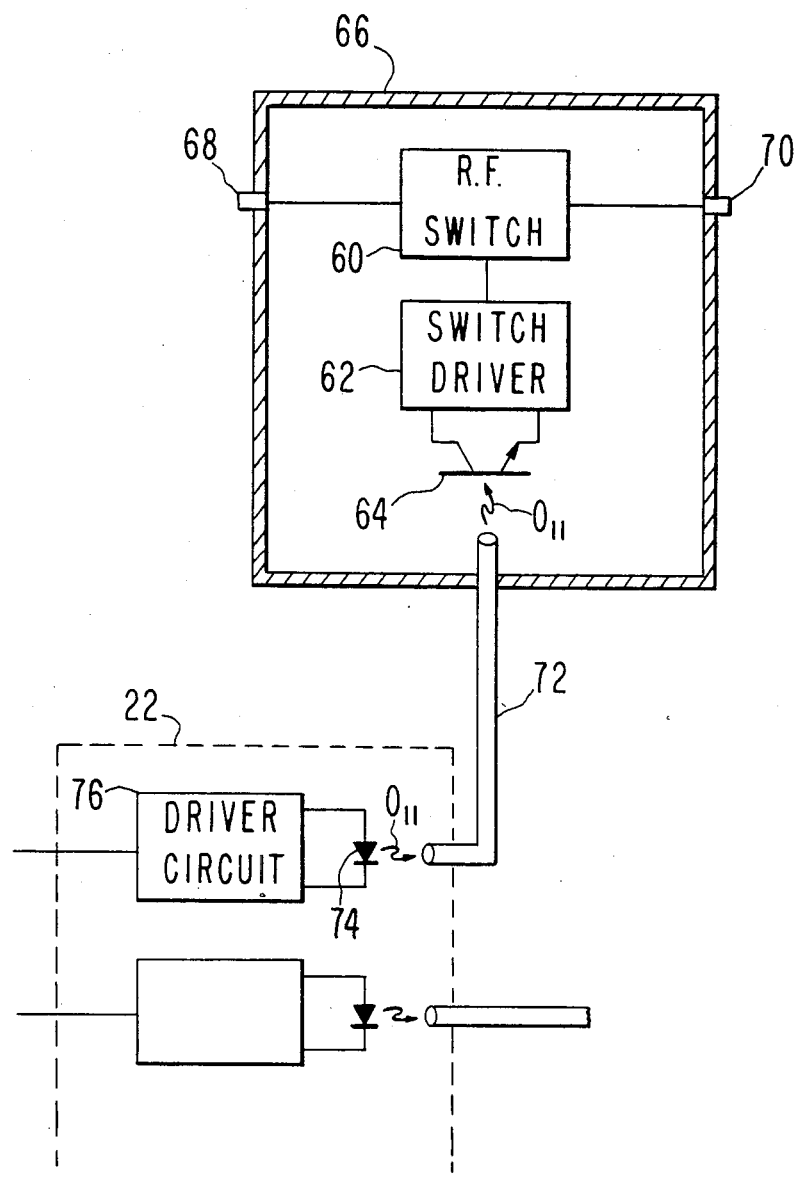

RF SWITCHING APPARATUS UTILIZING OPTICAL CONTROL SIGNALS TO REDUCE SPURIOUS OUTPUT

BACKGROUND OF THE INVENTION

This invention relates to rf switching circuits and, more particularly, to low spurious output, high speed rf switching apparatus.

Frequency synthesizers have a capability of generating signals at a number of selectable frequencies and are utilized in a variety of applications. According to one technique known as direct frequency synthesis, a number of individual oscillators are coupled through a switching circuit, or multiplexer, to the inputs of a mixer. The mixer generates sum and difference frequencies of its two inputs. By appropriate switching circuit inputs, the desired oscillators can be connected to the inputs of the mixer. Using this technique, n oscillators can generate $n^2$ different output frequencies.

In many applications, such as in radar and electronic countermeasures, frequency synthesizers are required to generate a range of rf frequencies and must be switched between frequencies very rapidly. In addition, the synthesizer output must be relatively free of spurious, or unwanted, output signals. In practice, it has been difficult to satisfactorily meet all of the above requirements.

As is well known, rf signals are subject to stray coupling between adjacent circuit elements and to inadvertent coupling through conductors due to parasitic capacitances of circuit elements and inductance of ground conductors. Enclosure of rf circuitry in conductive housings is effective to contain radiated energy. However, connections to the conductive housing such as power and control connections provide a path for conduction of rf signals out of the housing. Such leakage signals usually appear at the output as spurious signals.

In the case of dc power connections, filtering of the rf signals is effective. In the case of high speed control signals, however, the frequency of the control signal can be close to the rf signal frequency. Construction of a filter to pass the control signal while blocking the rf signal is difficult. The filter response must be carefully tailored and typically requires a large number of poles. Such filters are large and expensive.

It is an object of the present invention to provide novel rf switching apparatus.

It is another object of the present invention to provide rf switching apparatus having low spurious output.

It is still another object of the present invention to provide frequency synthesizers having low spurious output and a capability of high speed switching between frequencies.

It is yet another object of the present invention to provide rf switching apparatus wherein the switching control signal is optically coupled to the rf switching circuit.

SUMMARY OF THE INVENTION

According to the present invention, these and other objects and advantages are achieved in a novel switching apparatus. The switching apparatus comprises a plurality of rf switch assemblies, each including rf switch means for switching an input rf signal in response to an optical control signal and providing a switched rf signal. Each switch assembly further includes conductive enclosure means substantially surrounding the rf switch means and adapted for receiving the optical control signal. The switching apparatus further comprises control means for providing the optical control signals in response to select signals. The switched rf signals are coupled to an output of the switching apparatus. The use of optical control signals for controlling the rf switch assemblies provides a low level of spurious output. In a preferred embodiment, optical fibers are utilized for coupling the optical control signal to the conductive enclosure means.

According to another aspect of the present invention, there is provided a direct frequency synthesizer comprising signal generating means operative to generate n rf signals, frequency summing means operative to provide an output signal at a frequency which is the sum or difference of signals appearing at two inputs, and switching apparatus as described above. The switching apparatus is operative to switch selected ones of the n rf signals to each of the inputs of the frequency summing means in response to frequency select signals. The use of optical control signals provides a low level of spurious synthesizer output.

BRIEF DESCRIPTION OF THE DRAWINGS

For a better understanding of the present invention, together with other and further objects, advantages and capabilities thereof, reference may be had to the accompanying drawings which are incorporated herein by reference and in which:

FIG. 1 is a block diagram of a direct frequency synthesizer in accordance with the present invention;

FIG. 2 is a block diagram of the multiplexer portion of the frequency synthesizer shown in FIG. 1; and FIG. 3 is a block diagram illustrating an individual rf switch in accordance with the present invention.

DETAILED DESCRIPTION OF THE INVENTION

A direct frequency synthesizer incorporating the switching apparatus of the present invention is illustrated in FIG. 1. A plurality of signal sources 10, 12, 14 have outputs coupled to a switching apparatus, or multiplexer 20, and have rf output frequencies $f_1$, $f_2$, $f_3$, respectively. The multiplexer 20 is an rf switching circuit having a pair of rf outputs $m_1$, $m_2$. A control circuit 22 controls the operation of the multiplexer 20 as described hereinafter. The multiplexer outputs $m_1$, $m_2$ are coupled through amplification and filtering circuits 24, 26, respectively, to the inputs of a mixer 30. In addition, the multiplexer outputs $m_1$, $m_2$ can be coupled through frequency shifting means (not shown) such as frequency multipliers or frequency dividers to obtain the desired input frequencies to the mixer 30. The output of the mixer 30 is passed through an amplification and filtering circuit 34 to provide the output of the frequency synthesizer.

In operation, the output of one of the signal sources 10, 12, 14 is switched by the multiplexer 20 to output $m_1$, and one of the signal source outputs is switched to output $m_2$. After amplification and filtering (and optional frequency shifting) of the multiplexer outputs $m_1$, $m_2$, the mixer 30 combines the two signals in a nonlinear element, as is well known in the art, to provide sum and difference frequencies. The output of the mixer 30 is amplified and filtered in the circuit 34 to provide the desired output frequency. When, for example, the signal source 10 at $f_1$ and the signal source 12 at $f_2$ are selected by the multiplexer 20, the output frequency is $f_1+f_2$. It will be understood that the number of signal sources utilized in the frequency synthesizer is determined by the required number of output frequencies. When n signal sources are used, $n^2$ output frequencies can be obtained.

The multiplexer 20 is illustrated in FIG. 2. The output of the signal source 10 at frequency $f_1$ is coupled to the inputs of rf switch assemblies 40, 42. The output of the signal source 12 at frequency $f_2$ is coupled to the inputs of rf switch assemblies 44, 46. The output of the signal source 14 at frequency $f_3$ is coupled to the rf switch asssemblies 48, 50. The outputs of the rf switch assemblies 40, 44, 48 are coupled through a power combiner 54 to the output $m_1$ of the multiplexer 20. The outputs of the rf switch assemblies 42, 46, 50 are coupled through a power combiner 56 to the output $m_2$ of the multiplexer 20. The power combiners 54, 56 provide impedance matching between the outputs of the rf switch assemblies and the circuits 24, 26, respectively. Optical control signals $O_{11}$, $O_{12}$, $O_{13}$, $O_{21}$, $O_{22}$, $O_{23}$ are coupled to the rf switch assemblies 40, 44, 48, 42, 46, 50, respectively, by means of optical fibers, as described hereinafter. In response to the optical control signals, the rf switch assemblies switch one of the signal sources to each of the outputs $m_1$, $m_2$ of the multiplexer 20. While the multiplexer 20 is illustrative of switching apparatus in accordance with the present invention, it will be understood that any number of inputs and any number of outputs can be provided.

Referring now to FIG. 3, there is shown the rf switch assembly 40, which is typical of all the rf switch assemblies in FIG. 2, and a portion of the control circuit 22. The rf switch assembly 40 includes an rf switch 60 coupled to a switch driver 62 which in turn is coupled to optical receiver 64. A conductive enclosure 66 surrounds the rf switch 60, the switch driver 62 and the optical receiver 64 and functions as an electromagnetic shield. The enclosure 66 can be in the form of a metal box or an appropriately dimensioned cavity milled into a larger rf chassis. The input and the output of the rf switch 60 can be coupled through rf connectors 68, 70. The optical receiver 64 receives the optical control signal $O_{11}$ from an optical fiber 72 which passes through a small aperture in the enclosure 66 and is coupled to the control circuit 22. The optical fiber 72 receives the optical control signal $O_{11}$ from an optical transmitter 74 which is energized by a driver circuit 76. The optical transmitter 74 is energized or deenergized by the driver circuit 76 in response to an input control signal. The control circuit 22 includes additional circuitry for providing optical control signals to all of the rf switch assemblies. The input control signals to the control circuit 22 can be provided by a computer or other system controller.

In operation, the rf switch has a low impedance on state and a high impedance off state which are controlled by the switch driver 62. A suitable rf switch includes PIN diodes which are forward biased or reversed biased. The appropriate diode bias current is supplied by the switch driver 62 when it is energized by the optical receiver 64. In the example of FIG. 3, the driver circuit 76 supplies a current to the optical transmitter 74 which is a photodiode. The light emitted from the photodiode passes through the optical fiber 72 and impinges upon the optical receiver 64 which is a phototransistor. The phototransistor is turned on and actuates the rf switch. It will be understood that the circuit can also be designed such that the absence of light passing through the optical fiber 72 turns on the rf switch 60. Furthermore, it will be understood that other types of optical transmitter and optical receiver can be used. The optical control signal $O_{11}$ can pass through air between the transmitter 74 and the receiver 64. However, the mechanical design of the system is simplified by the use of the optical fiber 72. Alternatively, mating optical fiber connectors mounted on the optical fiber 72 and on the enclosure 66 can be utilized for coupling the optical control signal into the switch assembly.

The optical coupling of control signals between the control circuit 22 and the rf switch assembly 40 permits high speed rf switching and virtually eliminates spurious signal leakage on the switch control lines, since the optical fiber 72 is not a conductor of rf signals. Thus, isolation between the input and the output of the rf switch assembly is improved, and crosstalk between adjacent rf switch assemblies is reduced. Any leakage is due to radiation through the aperture provided in the enclosure 66 for the optical fiber 72. Therefore, the aperture should have the minimum dimension which will permit passage of the optical fiber 72.

Switching apparatus constructed, as shown in FIGS. 1–3 and described hereinabove, has exhibited isolation between input and output greater than 100 dB over a frequency range from 100 MHz to 500 MHz. The switching delay, including delay attributable to the optical control signal, was about 150 nanoseconds. Furthermore, spurious output caused by crosstalk between two switch assemblies mounted in the same chassis was more than 100 dB below the desired signal output.

While there has been shown and described what is at present considered the preferred embodiment of the invention, it will be obvious to those skilled in the art that various changes and modifications may be made therein without departing from the scope of the invention, as defined by the appended claims.

What is claimed is:

1. Switching apparatus for switching at least one rf signal selected from a plurality of rf signals to an output with a low level of spurious output from nonselected rf signals, comprising:
    a plurality of rf switch assemblies each comprising:
        rf switch means for switching one of said plurality of rf signals in response to an optical control signal and providing a switched rf signal and
        conductive enclosure means substantially surrounding said rf switch means and adapted for coupling of said one of said plurality of rf signals, said switched rf signal and said optical control signal therethrough;
    control means for providing said optical control signal to selected rf switch assemblies in response to select signals; and
    means for coupling said switched rf signals from said rf switch assemblies to an output of said switching apparatus
    whereby the use of optical control signals for controlling said rf switch means provides a low level of spurious output from nonselected rf signals.

2. The switching apparatus as defined in claim 1 further including optical fibers for transmission of said optical control signals between said control means and each of said rf switch assemblies.

3. The switching apparatus as defined in claim 2 wherein each of said conductive enclosure means includes an aperture for passage of one of said optical fibers.

4. The switching apparatus as defined in claim 3 wherein each of said rf switch means includes a diode switching circuit having an on state and an off state, and a switch driver and an optical receiver operative in combination to control the state of said diode switching circuit in response to said optical control signal.

5. A direct frequency synthesizer comprising:
signal generating means operative to generate n rf signals;
frequency summing means operative to provide a synthesizer output signal at a frequency which is the sum or difference of signals appearing at two inputs; and
switching apparatus operative to switch selected ones of said n rf signals to each of the inputs of said frequency summing means in response to frequency select signals, said switching apparatus comprising
a plurality of rf switch assemblies each including rf switch means for switching one of said n rf signals in response to an optical control signal and providing a switched rf signal to one of the inputs of said frequency summing means when selected, and further including conductive enclosure means substantially surrounding said rf switch means and adapted for receiving said optical control signal, and
control means for providing said optical control signal to said rf switch assemblies in response to said frequency select signals such that two selected ones of said n rf signals are supplied to the two inputs of said frequency summing means
whereby the use of optical control signals for controlling said rf switch means provides a low level of spurious synthesizer output.

6. The frequency synthesizer as defined in claim 5 further including optical fibers for transmission of said optical control signals between said control means and each of said rf switch assemblies.

7. The frequency synthesizer as defined in claim 6 wherein each of said conductive enclosure means includes an aperture for passage of one of said optical fibers.

8. The frequency synthesizer as defined in claim 5 wherein each of said rf switch means includes a PIN diode switching circuit having an on state and an off state, and a switch driver and an optical receiver operative in combination to control the state of said switching circuit in response to said PIN diode optical control signal.

9. The frequency synthesizer as defined in claim 8 further including means for amplification and filtering of the output of said frequency summing means.

10. The frequency synthesizer as defined in claim 9 wherein said signal generating means includes n signal sources each operating at a different frequency.

11. The frequency synthesizer as defined in claim 10 further including means coupled between said switching apparatus and said frequency summing means for shifting the frequencies of said switched rf signals.

* * * * *